(12) United States Patent
Eidson et al.

(10) Patent No.: US 6,681,101 B1
(45) Date of Patent: Jan. 20, 2004

(54) RF TRANSMITTER WITH EXTENDED EFFICIENT POWER CONTROL RANGE

(75) Inventors: Brian Eidson, San Diego, CA (US); Mats Lindstrom, San Diego, CA (US); Robert Edmund Grange, San Diego, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/481,094

(22) Filed: Jan. 11, 2000

(51) Int. Cl.[7] ................................................. H04B 1/04
(52) U.S. Cl. ............................... 455/127.1; 455/127.3; 455/127.2; 455/126
(58) Field of Search .............................. 455/118, 127.1, 455/245.1, 126, 127, 127.2, 127.3; 330/10, 103, 124 R, 284, 129, 51; 332/103

(56) References Cited

U.S. PATENT DOCUMENTS

| | | | |
|---|---|---|---|
| 4,758,802 A | | 7/1988 | Jackson |
| 5,055,800 A | | 10/1991 | Black et al. |
| 5,095,542 A | * | 3/1992 | Suematsu et al. ........... 455/574 |
| 5,111,162 A | | 5/1992 | Hietala et al. |
| 5,365,190 A | * | 11/1994 | Yu et al. ................... 455/226.1 |
| 5,640,692 A | * | 6/1997 | Bothorel ..................... 455/115 |
| 5,661,434 A | | 8/1997 | Brozovich et al. |
| 5,758,269 A | * | 5/1998 | Wu ............................. 455/115 |
| 5,903,194 A | * | 5/1999 | Opsahl et al. .............. 330/149 |
| 6,256,482 B1 | * | 7/2001 | Raab .......................... 330/199 |

OTHER PUBLICATIONS

Brown, M., "Practical Switching Power Supply Design," San Diego: Academic Press, Inc., pp. 9–15 (1990).
Brown, M., "Practical Switching Power Supply Design," San Diego: Academic Press, Inc., pp. 17–42 (1990).
Brown, M., "Practical Switching Power Supply Design," San Diego: Academic Press, Inc., pp. 43–65 (1990).
Brown, M., "Practical Switching Power Supply Design," San Diego: Academic Press, Inc., pp. 67–95 (1990).
Brown, M., "Practical Switching Power Supply Design," San Diego: Academic Press, Inc., pp. 199–233 (1990).
Candy, J., et al., "Oversampling Methods for A/D amd D/A Conversion," Oversampling Delta–Sigma Data Converters—Theory, Design, and Simulation, New York: IEEE Press, pp. 1–25 (1992).
Raab, F., et al., "High–Efficiency Single–Sideband HF/VHF Transmitter Based on Envelope Elimination and Restoration," Radio Systems and Techniques' IEE Conference Publication No. 392, pp. 21–24 (Jul. 4–7, 1994).

* cited by examiner

*Primary Examiner*—Vivian Chin
*Assistant Examiner*—Yuwen Pan
(74) *Attorney, Agent, or Firm*—Weide & Miller, Ltd.

(57) ABSTRACT

A highly efficient radio frequency (RF) transmitter provides both wide bandwidth and an extended power control range. The RF transmitter includes stage switching, bias adjustment, and drain supply modulation. These components are used to provide fine and coarse power control and EER envelope fluctuations. The RF transmitter is useful in wireless communications to increase both handset talk time and battery life.

15 Claims, 3 Drawing Sheets

RF TRANSMITTER WITH EXTENDED EFFICIENT POWER CONTROL RANGE

TECHNICAL FIELD

The present invention relates generally to radio frequency (RF) transmitters and, more particularly, to RF transmitters with multiple power level capability.

BACKGROUND

Solid-state amplifiers, such as RF power amplifiers, are widely used for wireless communications. The goal of these power amplifiers is to achieve high operating efficiencies.

Various techniques have been employed to provide multiple power level capability for wireless communications. One technique is to place an attenuator before power amplifier to reduce the output signal level from the amplifier. Because, however, the power amplifier is configured to operate efficiently only at a specific instantaneous power level, the amplifier's operating efficiency is limited.

Envelope elimination and restoration (EER) power amplifiers have been known for many years. Generally, the efficiency of the EER amplifier is controlled by using circuit elements to modulate a supply voltage. A common EER amplifier topology uses a switching mode power supply to modulate the drain voltage of a single stage RF power amplifier. A pulse width modulator (PWM) feeds the power amplifier. The output of the amplifier is then passed to a low-pass filter, and the filtered output is used to modulate the drain of a MOSFET configured as a single-stage class D RF amplifier. The PWM applies a simple feedback mechanism to shape its output. A conventional EER amplifier only operates at very low bandwidth signals, such as 3–30 kHz, and does not operate efficiently over a wide range of average power output levels. This can contribute to low operating efficiencies. For low bandwidth signals, a conventional EER amplifier also fails to reduce the amount of in-band quantization (i.e., switching) noise in the output signal. The result is that the output signal must be sampled at very high rates, which causes significant losses in the output signal.

SUMMARY

In general, the present invention is directed to a highly efficient RF transmitter including a power amplifier circuit with an extended efficient power control range. The preferred RF transmitter may be configured to operate over a wide variety of communication standards. An RF transmitter implementing the invention is highly efficient for nonconstant-envelope modulation formats and can operate over extended control ranges for high frequency/wide bandwidth operations, such as wireless communications.

In one aspect, the invention is directed to an RF transmitter that includes a signal processing block. A supply modulator is responsive to an envelope output of the signal processing block, and a FM modulator is responsive to a phase output of the signal processing block. A power amplifier circuit including a plurality of cascaded amplifiers is coupled to the supply modulator, and an attenuator is coupled between the FM modulator and the power amplifier circuit.

Implementations of the invention include one or more of the following. The RF transmitter may include switching circuitry configured to bypass selected ones of the amplifiers, when the supply modulator operates in a low power mode. The amplifiers may be used to impart a gain to an output signal of the attenuator. The RF transmitter also includes a modulator connected between the envelope output and the supply modulator, where an output of the modulator further includes a high speed binary pulse stream.

In another aspect, the present invention is directed to an RF transmitter that includes a signal processing block configured to convert an input signal into an envelope signal and a phase signal. A supply modulator is responsive to the envelope signal, and a FM modulator receives the phase signal. An attenuator is configured to attenuate the output of the FM modulator, and a power amplifier circuit is coupled between the attenuator and the supply modulator.

The preferred transmitter has many benefits. The preferred transmitter may be implemented in a wireless handset. This wireless handset may have longer talk times and smaller and lighter batteries. Further, the preferred transmitter reduces the size and cost of the handset and makes the handset more attractive to the wireless customer. The extended operating range of the transmitter using power control also lengthens the handset's battery life.

The details of one or more embodiments of the invention are set forth in the accompanying drawings and the description below. Other features, objects, and advantages of the invention will be apparent from the description and drawings, and from the claims.

DETAILED DESCRIPTION

In general, the present invention is directed to a highly efficient RF transmitter including a power amplifier (PA) circuit with an extended efficient power control range. The RF transmitter may be configured to operate using communication standards, such as the cellular telephone standard IS-95, that operate over a wide bandwidth (e.g., greater than 1 MHz) and an extended power control range (e.g. about 70 dB or more).

In a preferred implementation, a highly efficient envelope elimination and restoration (EER) type power amplifier circuit is used. To achieve high efficiency in this type of power amplifier circuit, a modulated signal is polar decomposed into an envelope component and a phase component. The phase component is FM modulated around a desired carrier frequency to produce a constant envelope component. A supply voltage (e.g., the drain voltage for a FET or the collector voltage for a BJT) of the PA circuit is modulated by the envelope signal, and an input of the PA circuit (e.g., the gate for a FET or the base for a BJT) is driven by the constant-envelope signal component. For an EER amplifier, the overall operating efficiency is highly dependent on the efficiency of the circuit elements that modulate the supply voltage. This is because the circuitry modulating the supply voltage must process the energy that the PA circuit converts to RF energy. In particular, the overall PA circuit efficiency is the product of the supply modulator efficiency and the RF PA circuit efficiency.

Figure 1:
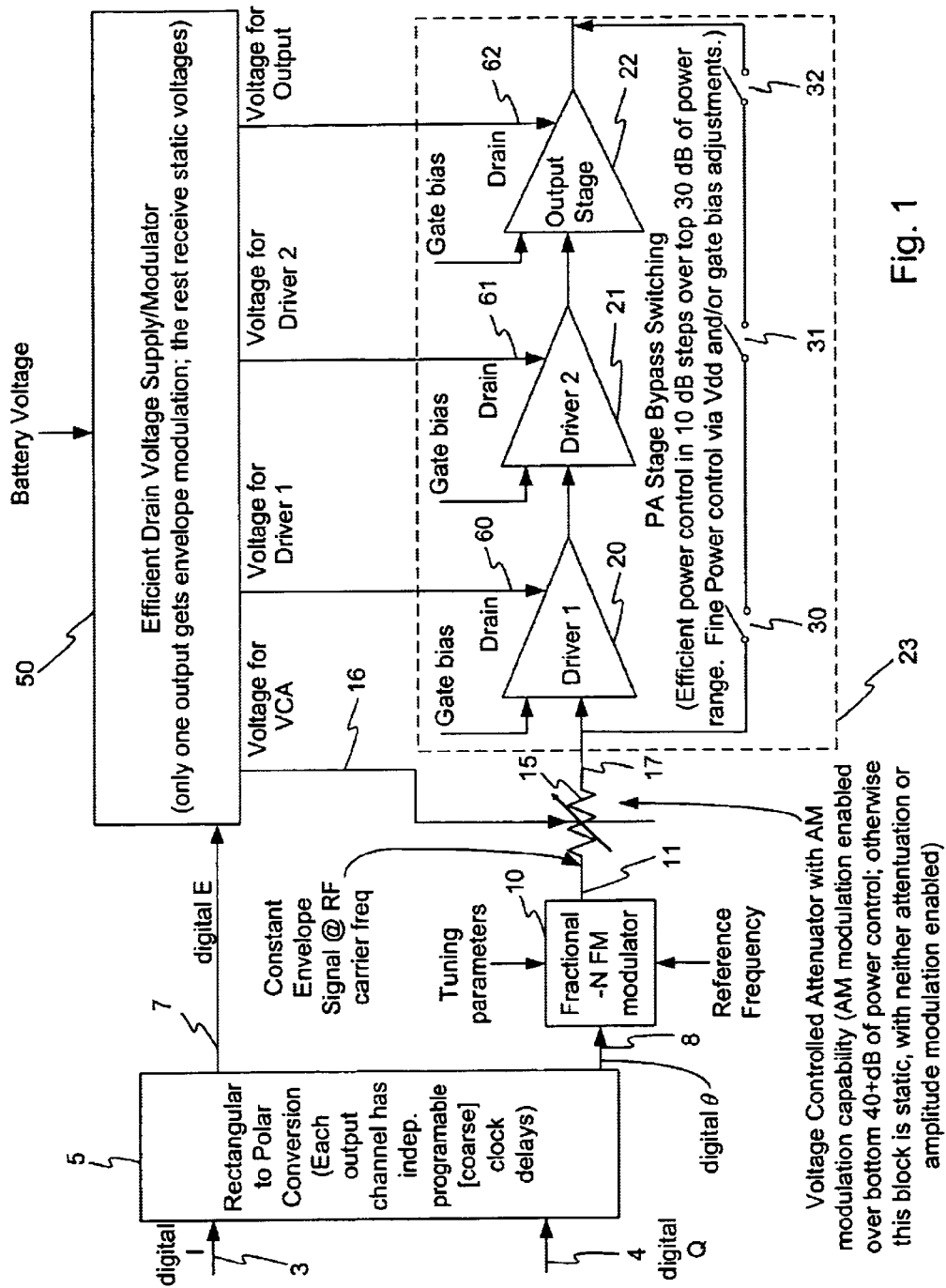
FIG. 1 illustrates one embodiment of a RF transmitter with extended efficient power control range.

FIG. 1 illustrates a preferred RF transmitter having an in-phase input 3 and a quadrature input 4. The inputs 3 and 4 may be digital signals arriving from, for example, a baseband IC (not shown). The inputs 3, 4 are received by a signal processing block 5, which converts the in-phase input 3 and the quadrature input 4 into an envelope component signal 7, and converts the in-phase input 3 and the quadrature input 4 into a phase component signal 8. Like the inputs 3, 4, the envelope and phase component signals 7, 8 are usually digital signals. The signal processing block 5 includes digital delay elements that deliver integer clock-cycle delays to delay the envelope component signal 7 and the phase component signal 8 with respect to each other. This provides coarse compensation for delay differences between the component signals.

In FIG. 1, the phase component signal 8 is delivered to an FM modulator 10. The FM modulator 10 modulates the phase component signal 8 onto any suitable RF carrier frequency. For example, the carrier may be 800 MHz for a cellular band and 1.9 GHz for a PCS band. In general, the FM modulator 10 tunes the RF carrier frequency to a desired operating channel. For example, the operating channel may be about 1.25 MHz apart for the IS-95 standard and 30 KHz apart for the cellular telephone standard IS-136. The output 11 of the FM modulator 10 is a constant-envelope signal having a low power level, typically about 30–40 dB below the peak output power level of the transmitter 1. A common value for the peak output power level is about 30 dB.

To transmit at low average power of about 20–30 dB below the maximum operating power of the transmitter, the transmitter 1 also includes a voltage control attenuator (VCA) 15 that AM modulates the constant-envelope output 11 into an AM-modulated (envelope modulated) signal 17 that feeds a power amplifier circuit 23 described below, when the power amplifier 23 is bypassed for very low average power levels. These power levels may be below 0 dBm.

In the illustrative embodiment, the power amplifier circuit 23 is a three-stage power amplifier circuit including first and second driver amplifiers 20, 21, and an additional output stage amplifier 22.

The first-stage driver amplifier 20 includes a drain input terminal 60 and a switch 30. The second stage driver amplifier 21 also includes a drain input terminal 61 and a switch 31. The output stage amplifier 22 also includes a drain input terminal 62 and a switch 32. Each of the amplifiers 20, 21, 22 is used to impart gain to the output signal 17 from the VCA 15.

The transmitter 1 uses a voltage supply modulator 50 connected to the drain input terminals 60, 61, 62 and the voltage control input of the VCA 15. In this configuration, operating at full power, the supply modulator 50 supplies a constant DC voltage to the driver amplifiers 20, 21 and a modulated signal to the output stage amplifier 22.

Figure 2:
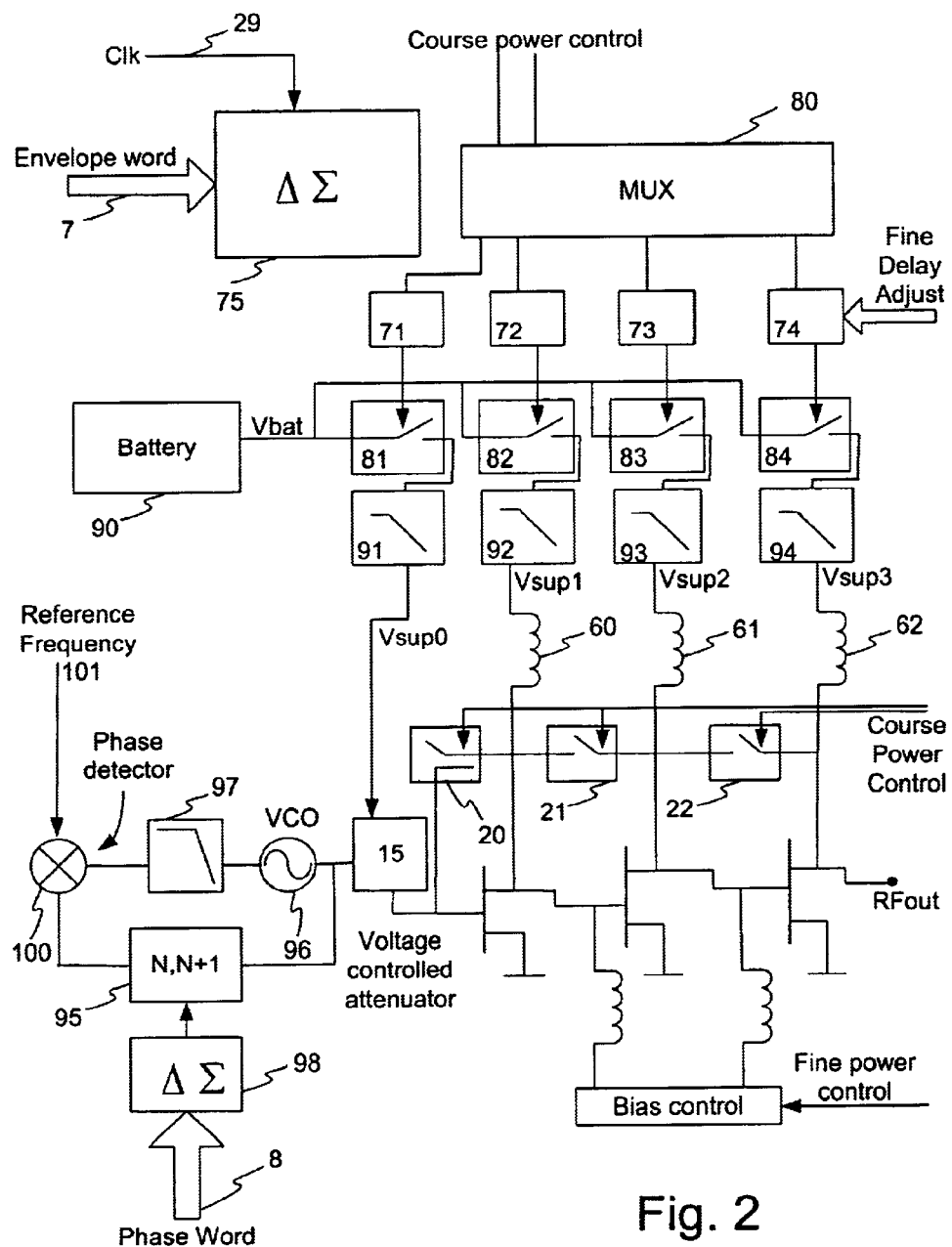
FIG. 2 illustrates a supply modulator for the RF transmitter of FIG. 1.

FIG. 2 shows the supply modulator 50 in more detail. The supply modulator 50 includes a delta-sigma (Δ-Σ) modulator 75 having a clock input 79. The Δ-Σ modulator 75 receives the digital envelope component signal 7 from the signal processing block 5 and up-samples and Δ-Σ modulates this signal. The envelope component signal 7 provided to the Δ-Σ modulator 75 is usually a multi-bit envelope word fed through a delta-sigma D/A converter (not shown). The modulator 75 outputs a high speed binary pulse stream that is delayed for time alignment with the output signal 11 from the FM modulator 10. The output signal from the Δ-Σ modulator 75 is then delivered to the multiplexer 80 and filtered and presented to the driver amplifiers 20, 21 and output stage amplifier 22, as described above. The multiplexer 80 provides input to delay lines 71–74. Each of the delay lines 71–74 connects to a corresponding one of several switching transistors 81–84. The switching transistors 81–84 each supply a selected current level to one of several low-pass filters 91–94. This causes the digital signals from the above generated pulse stream to be converted to analog drain voltages to be fed to the drain terminals 60, 61, and 62.

The delay lines 71–74 are used to achieve precise time alignment of the envelope component signal 7 and the phase component signal 8 throughout the transmitter 1.

When one of the driver amplifiers 20, 21 or the output stage amplifier 22 is in a non-AM modulated mode, a static voltage is supplied to the input drain terminal of that power amplifier by a device, such as a battery 90. The corresponding switching transistor 81–84 remains closed.

Figure 3:
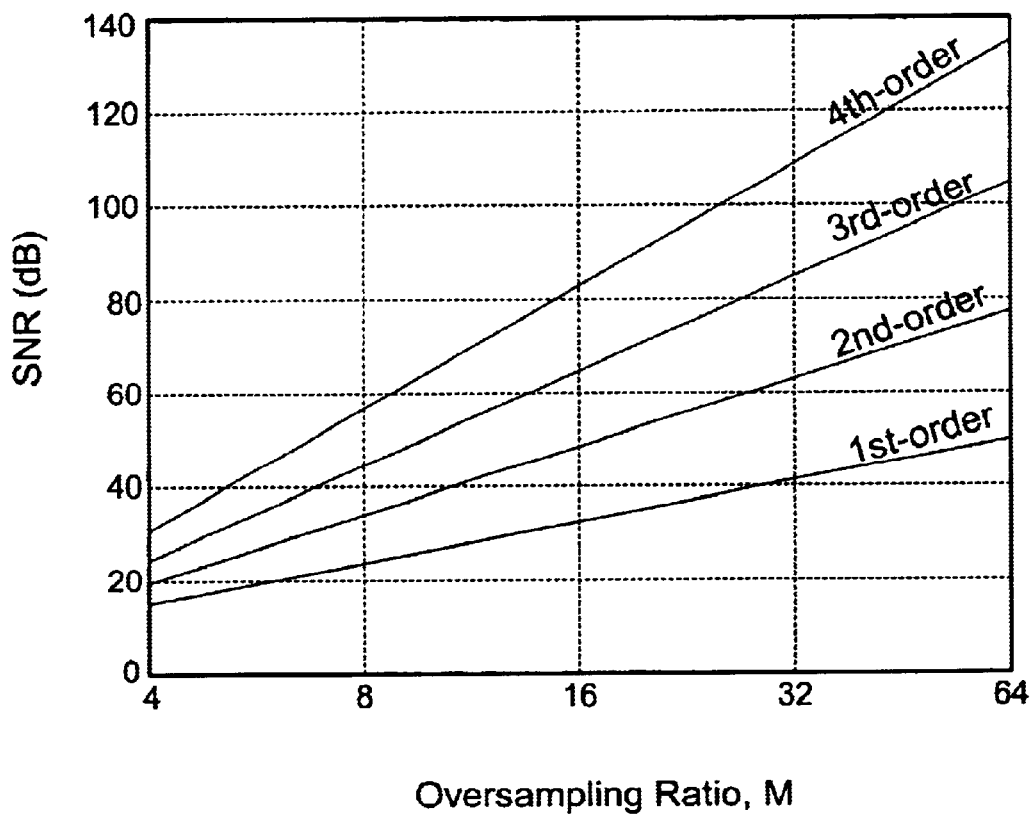
FIG. 3 illustrates a graph of the oversampling ratio versus signal-to-noise (SNR) ratio for a one bit delta-sigma modulator.

In certain embodiments, the Δ-Σ modulator 75 and the FM modulator 10 are delta-sigma Pulse Density Modulator (PDM) converters. These PDM converters can be used to transform the envelope and phase component signals 7, 8 into one-bit, high-rate samples. FIG. 3 shows that the oversampling rate depends on the order of the converter and the desired signal-to-quantization noise of the resulting signal. These modulators also push the majority of the quantization noise of the envelope and phase component signals 7, 8 outside of the operating bandwidth, where it can be filtered away.

The phase component signal 8 provided to the FM modulator 10 is usually a multi-bit phase word that is sigma-delta up-sampled by a converter 98 to a high-speed, one-bit stream. This stream is presented to a control input of a synthesizer 95 having an N, N+1 divider. The synthesizer output causes a voltage controlled oscillator 96 to generate a phase-modulated carrier signal centered at a selected frequency. For example, the carrier frequency could be 800 MHz or 1.9 GHz. An optional loop filter 97 removes out-of-band noise and spurs generated by the converter 98. A phase detector 100 coupled to a reference frequency source 101 may be used to perform the modulation in the FM modulator 10.

The transmitter 1 may operate at low nominal signal powers, for example, 30 dB below the maximum output power of the output stage 22. In general, these signals cannot be realized by bypassing the driver amplifiers 20, 21 or the output stage amplifier 22. Thus, in a preferred configuration, the VCA 15 reduces its nominal power output and processes the input signal 11 imparting AM modulation. The input 11 may also be envelope modulated using the signal 16 from a supply modulator 50. At this stage, the output 17 may include an AM and FM modulated signal that can bypass the driver amplifiers 20, 21 and the output stage amplifier 22, and the resulting signal is then sent to an antenna (not shown) via the output stage amplifier 22.

The cascaded driver amplifiers 20, 21 and output stage amplifier 22 allow the transmitter 1 to also operate at maximum average power, which may be about 30 dBm for the IS-95 standard. However, for efficient power control with sufficient linearity over the 30 dB power control range, bypassing of the driver amplifiers 20, 21 and the output stage amplifier 22 in stages is necessary. This is because envelope restoration through drain modulation and variable gate biasing of the driver circuits 40, 41, 42 is linear for a single stage of the power amplifier circuit 23 only for a limited range of gains. This range may be about 6–20 dB.

The bypassing of one or more of the driver amplifiers 20, 21 or the output stage amplifier 22 is as follows. To bypass the driver amplifiers 20, 21 and the output stage amplifier 22, the switches 30, 31, 32 are closed to create a single path around the amplifiers 20, 21, and 22. As a result, the output amplifier stage 22 is shut off for power levels around 10 dB below the maximum output level of the transmitter 1 by bypassing the output amplifier stage 22 through disconnecting the drain terminal 62. As a result, the driver circuit 41 can be drain modulated through the drain terminal 61 to superimpose the AM modulation to the constant-envelope output signal 18 from the driver circuit 40. To impart an attenuation of about 20 dB below the maximum output level, the output stage amplifier 22 and the second stage amplifier 21 can be bypassed through disconnecting the drain terminals 62 and 61, respectively. To impart an attenuation of about 30 dB below the maximum output level, the drain terminals 62, 61, and 60 can be disconnected to bypass the amplifiers 22, 21, and 20, respectively. Switching in this manner increases the power output level in increments of about 10 dB, which provides for coarse power control. Fine power control (e.g., sub-dB increments) can be achieved by adjusting the DC operating level of the output-stage power amplifier 22. Fine power control may also be achieved by fine tuning any of the drain bias signals via drain terminals 60, 61, and 62 from the supply modulator 50.

The transmitter described above is efficient for wireless communications. One benefit is that wireless handsets have longer talk times and smaller and lighter batteries. The preferred transmitter reduces the size and cost of the handset and makes the handset more attractive to the wireless customer. The extended operating range of the transmitter using power control also lengthens the handset's battery life. Moreover, using the drain input terminals and the FM modulator to modulate the driver amplifiers and the output amplifier reduces the die size and external component counts in existing architectures using the IS-95 and IS-136 standards. As a result, the size and cost of wireless transceivers are significantly reduced. The transmitter also generates power output levels for CDMA applications that lead to longer talk times than current GSM handsets.

A number of embodiments of the present invention have been described. Nevertheless, it will be understood that various modifications may be made without departing from the spirit and scope of the invention. Accordingly, it is to be understood that the invention is not to be limited by the specific illustrated embodiment, but only by the scope of the appended claims.

What is claimed is:

1. A radio frequency (RF) transmitter for use in transmitting nonconstant-envelope signals, comprising:
   a signal processing block responsive to an input signal:
   a supply modulator responsive to an envelope output of the signal processing block;
   an FM modulator responsive to a phase output of the signal processing block; a power amplifier circuit having a plurality of amplifier stages each coupled to the supply modulator, and a plurality of switches configured to bypass selected amplifier stages, and
   an envelope modulator coupled between the envelope output and the supply modulator, wherein the supply modulator comprises:
      a multiplexer configured to receive a signal from the envelope modulator;
      plurality of delay lines connected to the multiplexer and to associated ones of the switches of the amplifiers; and
      a plurality of filters connected to corresponding ones of the switches and the drain input terminals, wherein a modulated signal is delivered to selected ones of the amplifiers.

2. The RF transmitter of claim 1, further comprising an attenuator coupled between the FM modulator and the power amplifier circuit.

3. The RF transmitter of claim 2, wherein the supply modulator is configured to drain-bias each amplifier stage through a drain input terminal of the amplifier stage.

4. The RF transmitter of claim 2, wherein the attenuator modulates an output of the RF transmitter under control of the supply modulator during low power operations.

5. The RF transmitter of claim 2, wherein the supply modulator is configured to provide a supply voltage of each of the amplifier stages and an attenuation control voltage to the attenuator.

6. The RF transmitter of claim 5, wherein the attenuator and the amplifier stages are serially cascaded, the switches are configured to each selectably bypass a single amplifier stage, and the supply modulator is configured to modulate, responsive to the envelope signal, only the voltage that it provides to the last unbypassed one of the amplifier stages and the attenuator.

7. The RF transmitter of claim 6, wherein the attenuator is configured to provide a static voltage to all other than the last of the unbypassed ones of the amplifier stages and the attenuator.

8. The RF transmitter of claim 7, wherein the supply modulator is further configured to provide incremental output power control by adjusting one or more DC drain bias levels.

9. The RF transmitter of claim 1, wherein each switch is configured for bypassing an associated amplifier stage.

10. The RF transmitter of claim 1, wherein the supply modulator is configured to control and output range of each of the amplifier stages that is not bypassed.

11. The RF transmitter of claim 1, wherein the plurality of amplifiers is cascaded, and the supply modulator is configured to modulate, responsive to the envelope output of the signal processing block, the output range of no more than one of the amplifier stages of the power amplifier circuit.

12. The RF transmitter of claim 1, wherein the FM modulator comprises:
   a delta-sigma D/A converter;
   a synthesizer having a N,N+1 divider; and
   a voltage controlled oscillator for generating a phase modulated carrier centered at a selected carrier frequency.

13. The RF transmitter of claim 1, wherein the signal processing block converts the input signal having rectangular coordinates into an output signal having polar coordinates.

14. The RF transmitter of claim 1, wherein the FM modulator is configured to frequency modulate the phase signal onto an RF carrier frequency.

15. The RF transmitter of claim 1, wherein the RF transmitter forms a portion of a handset for wireless communications.

* * * * *